(12) United States Patent
Lin

(10) Patent No.: US 8,217,454 B2
(45) Date of Patent: Jul. 10, 2012

(54) SEMICONDUCTOR DEVICE

(75) Inventor: Wei-Chieh Lin, Hsinchu (TW)

(73) Assignee: Sinopower Semiconductor Inc., Hsinchu Science Park, Hsinchu (TW)

( * ) Notice: Subject to any disclaimer, the term of this patent is extended or adjusted under 35 U.S.C. 154(b) by 44 days.

(21) Appl. No.: 13/025,176

(22) Filed: Feb. 11, 2011

(65) Prior Publication Data

US 2012/0126328 A1 May 24, 2012

(30) Foreign Application Priority Data

Nov. 22, 2010 (TW) .................................. 99140177 A

(51) Int. Cl.
*H01L 29/66* (2006.01)
(52) U.S. Cl. ........................................ 257/342; 257/368
(58) Field of Classification Search .................. 257/342, 257/368
See application file for complete search history.

(56) References Cited

U.S. PATENT DOCUMENTS

| 6,903,418 | B2 | 6/2005 | Iwamoto |
| 6,982,459 | B2 | 1/2006 | Suzuki |
| 7,042,046 | B2 | 5/2006 | Onishi |
| 7,115,475 | B2 | 10/2006 | Yamaguchi |
| 7,235,841 | B2 | 6/2007 | Onishi |
| 7,262,459 | B2 | 8/2007 | Takahashi |
| 2007/0272979 | A1 | 11/2007 | Saito |
| 2007/0290267 | A1 | 12/2007 | Yoshikawa |

*Primary Examiner* — Douglas Menz
(74) *Attorney, Agent, or Firm* — Winston Hsu; Scott Margo

(57) ABSTRACT

A semiconductor device includes an epitaxial layer having a first conductive type, and at least one first semiconductor layer and a second semiconductor layer having a second conductive type. The first semiconductor layer is disposed in the epitaxial layer of a peripheral region, and has an arc portion, and a first strip portion and a second strip portion extended from two ends of the arc portion. The first strip portion points to an active device region, and the second strip portion is perpendicular to the first strip portion The second semiconductor layer is disposed in the epitaxial layer of the peripheral region between the active device region and the second strip portion, and the second semiconductor has a sidewall facing and parallel to the first semiconductor layer.

16 Claims, 6 Drawing Sheets

SEMICONDUCTOR DEVICE

BACKGROUND OF THE INVENTION

1. Field of the Invention

The present invention relates to a semiconductor device, and more particularly, to a semiconductor device having a super junction structure.

2. Description of the Prior Art

In a metal oxide semiconductor (MOS) device, on-resistance (Rdson) between drain and source of the device is positive proportional to power consumption of the device, and thus the power consumption of the MOS device can be reduced by decreasing the on-resistance. Furthermore, resistance generated from an epitaxial layer used for bearing voltage occupies the largest percentage of the on-resistance. Although the resistance of the epitaxial layer can be raised by increasing the doping concentration of the dopant, the epitaxial layer is used to tolerate high voltage, and the breakdown voltage of the epitaxial layer is reduced when the doping concentration is increased, so that ability to tolerate the voltage of MOS device is reduced. For this reason, a semiconductor device having a super junction structure is developed to have both high voltage bearing ability and low on-resistance.

Refer to FIG. 1, which is a schematic diagram illustrating a cross-sectional view of a semiconductor device having a super junction structure according to the prior art. As shown in FIG. 1, the semiconductor device 10 includes an N-type substrate 12, an N-type epitaxial layer 14, a plurality of P-type semiconductor layers 16, a plurality of P-type doped body regions 18, a plurality of gate structures 20, a source metal layer 22 and a drain metal layer 24. The N-type epitaxial layer 14 has a plurality of deep trenches 26, and each P-type semiconductor layer 16 respectively is filled into each deep trench 26, so that the N-type epitaxial layer 14 and each P-type semiconductor layer 16 are disposed alternatively in sequence along a horizontal direction. In addition, each P-type doped body region 18 is disposed on each P-type semiconductor layer 16, and each gate structure 20 is respectively disposed on the N-type epitaxial layer 14 between the adjacent P-type doped body regions 18. The source metal layer 22 covers the N-type substrate 12 and is electrically connected to the P-type semiconductor layer 16. Because the N-type epitaxial layer 14 and each P-type semiconductor layer 16 constitute a PN structure, i.e. the super junction structure 28, a depletion region formed between the N-type epitaxial layer 14 and each P-type doped body region 18 can be extended to be between the N-type epitaxial layer 14 and each P-type semiconductor layer 16. Accordingly, the range of the depletion region can be increased, and the vertical electric field between the N-type epitaxial layer 14 and each P-type doped body region 18 so as to raise the voltage bearing ability. Furthermore, due to the decrease of the vertical electric field between the N-type epitaxial layer 14 and each P-type doped body region 18, the doping concentration of the N-type epitaxial layer 14 can be raised to reduce the resistance of the N-type epitaxial layer 14 in a vertical direction.

Refer to FIG. 2, which is a schematic diagram illustrating a top view of the semiconductor device according to the prior art. As shown in FIG. 2, the semiconductor device 10 of the prior art has an active device region 30 and a peripheral region 32 surrounding the active device region 30. The super junction structure 28 of the prior art extends to the peripheral region 32, and each P-type semiconductor layer 16 and the N-type epitaxial layer 14 in the peripheral region 32 surround the active device region 30. In the active device region 30, a top-view pattern of each P-type semiconductor layer 16 is rectangular, and corners of the P-type semiconductor layer 16 that is most adjacent to the peripheral region 32 is a right angle. In the P-type semiconductor layer 16 most adjacent to the peripheral region 32, a distance between a first point 34 and the P-type semiconductor layer 16 in the peripheral region 32 is different from a distance between a second point and the P-type semiconductor layer 16 in the peripheral region 32, so that an uneven electric field is generated between the P-type semiconductor layer 16 most adjacent to the peripheral region 32 and the N-type epitaxial layer 14 that are in contact with each other. For this reason, the breakdown voltage that the super junction structure 28 between the active device region 30 and the peripheral region 32 can tolerated is smaller than the breakdown voltage that the super junction structure 28 in the active device region 30 can tolerated, and the voltage bearing ability of the semiconductor device 10 is limited by the super junction structure 28 between the active device region 30 and the peripheral region 32. Therefore, the voltage bearing ability of the semiconductor device 10 cannot be determined by transistor devices in the active device region 30. In addition, because the super junction structure 28 between the active device region 30 and the peripheral region 32 having right angle, electric charges are easily accumulated at corners of the super junction structure 28, and generate high electric field. Therefore, voltage breakdown of the semiconductor device 10 is easily generated.

For these reasons, to solve the problems of the voltage bearing ability of the semiconductor device limited by the super junction structure between the active device region and the peripheral region and the high electric field generated by the right angle of the super junction structure is an important objective.

SUMMARY OF THE INVENTION

It is therefore an objective of the present invention to provide a semiconductor device to solve the problems of the above-mentioned semiconductor device according to the prior art.

According to an embodiment of the present invention, a semiconductor device is disclosed. The semiconductor device comprises a substrate, an epitaxial layer, at least one first semiconductor layer, and a second semiconductor layer. The substrate has a first conductive type and has an active device region and a peripheral region surrounding the active device region defined thereon. The epitaxial layer has the first conductive type and is disposed on the substrate. The first semiconductor layer has a second conductive type, and is disposed in the epitaxial layer of the peripheral region. The first semiconductor layer has an arc portion, a first strip portion extending out from an end of the arc portion, and a second strip portion extending out from the other end of the arc portion, wherein the first strip portion points to the active device region, and the second strip portion is perpendicular to the first strip portion. The second semiconductor layer has the second conductive type, and is disposed in the epitaxial layer of the peripheral region between the active device region and the second strip portion. The second semiconductor layer has a first sidewall and a second sidewall opposite to the first sidewall, and the first faces the first semiconductor layer, wherein the first sidewall is parallel to the first semiconductor layer, and a first distance is between the first sidewall and the first semiconductor layer.

The present invention provides the second P-type semiconductor layer parallel to the curved first P-type semiconductor layer in the semiconductor device, so that the distances between the adjacent P-type semiconductor layers can be the same. Accordingly, the N-type epitaxial layer between the adjacent P-type semiconductor layers can have the same width. Thus, the voltage bearing ability of the semiconductor device can be determined by the super junction structure in the active device region, and cannot be limited by the super junction structure between the active device region and the peripheral region. Furthermore, the high electric field generated from the right angle structure can be avoided.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
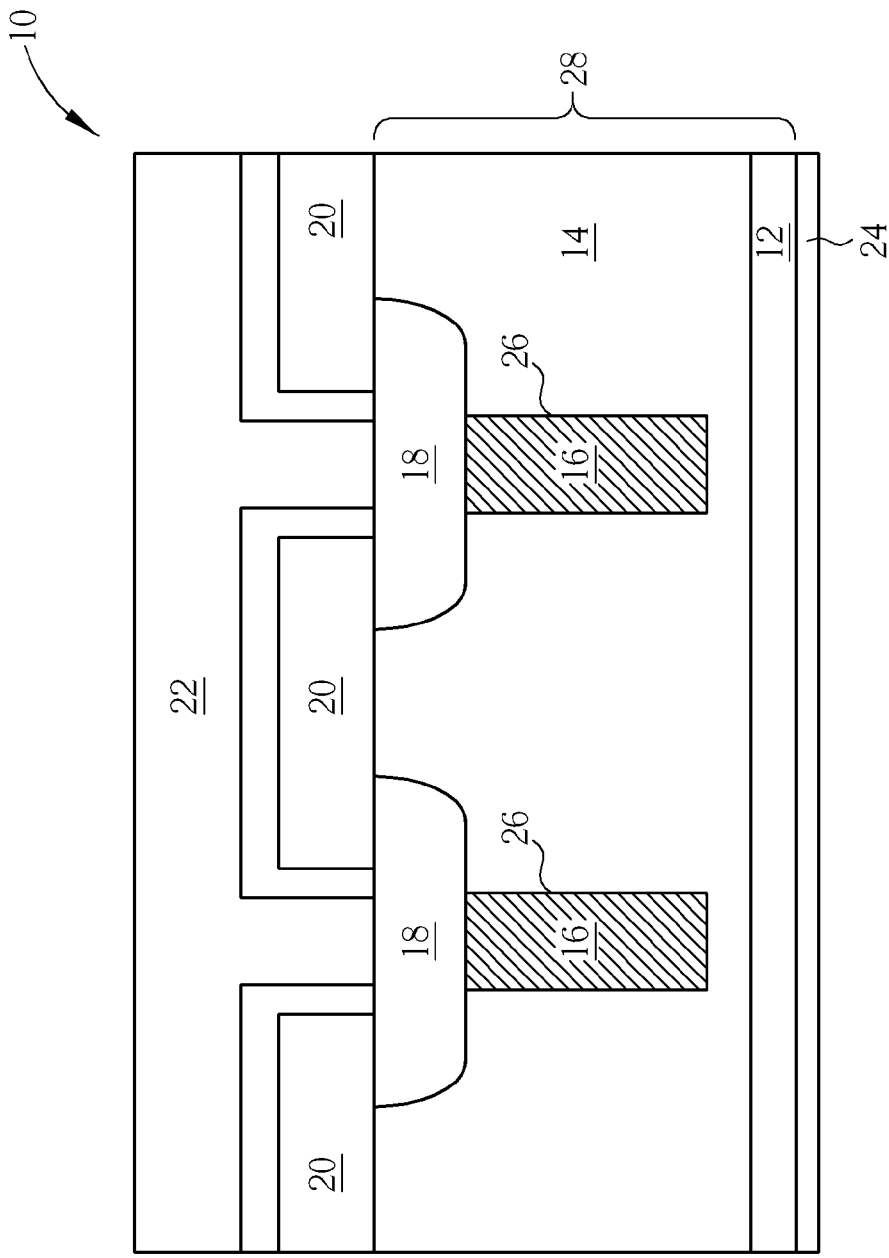
FIG. 1 is a schematic diagram illustrating a cross-sectional view of a semiconductor device having a super junction structure according to the prior art.
Figure 2:
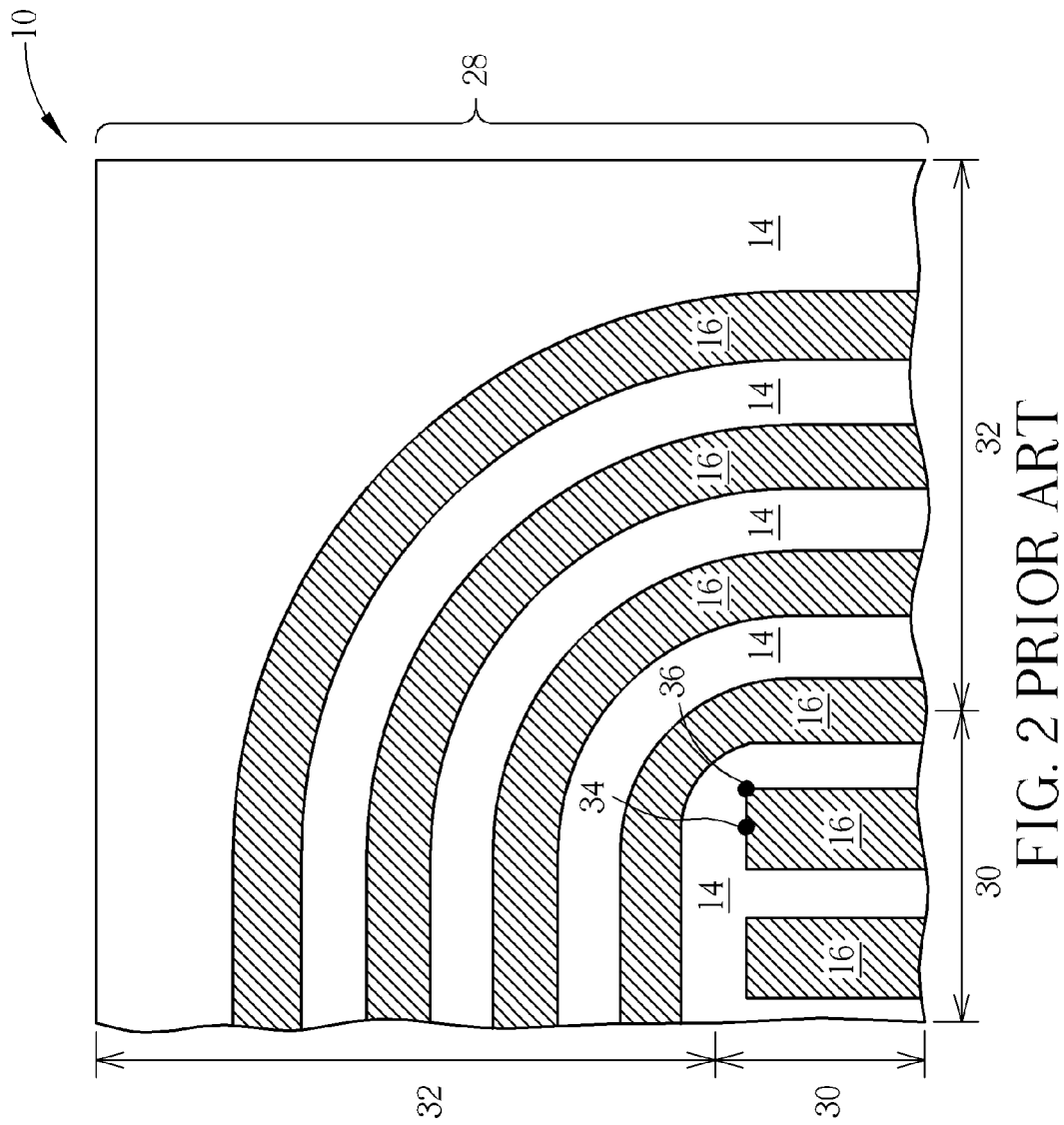
FIG. 2 is a schematic diagram illustrating a top view of the semiconductor device according to the prior art.
Figure 3:
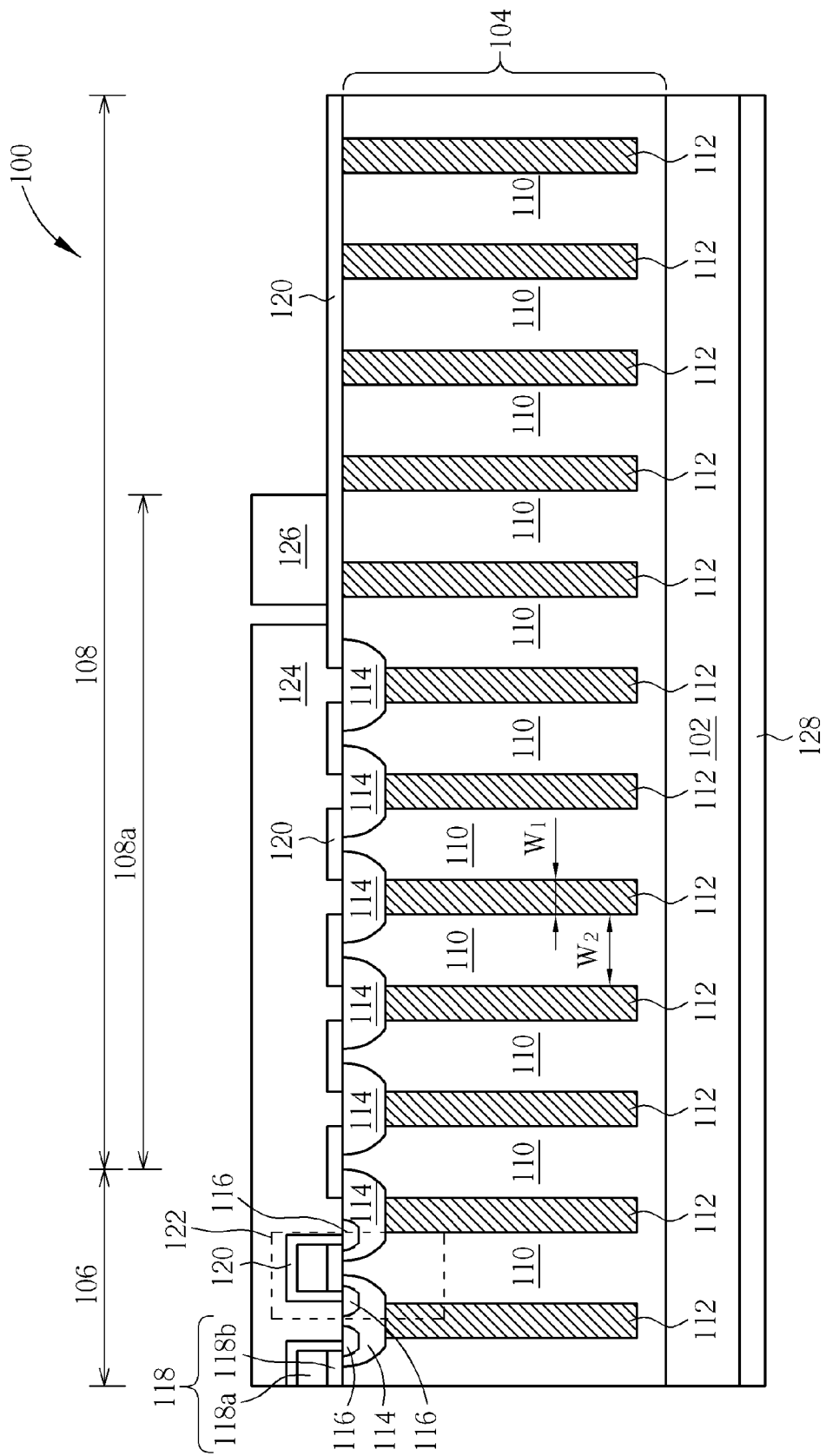
FIG. 3 is a schematic diagram illustrating a cross-sectional view of a semiconductor device according to a preferred embodiment of the present invention.

Refer to FIG. 3, which is a schematic diagram illustrating a cross-sectional view of a semiconductor device according to a preferred embodiment of the present invention. As shown in FIG. 3, the semiconductor device 100 of this embodiment includes a substrate 102 and a super junction structure 104. The substrate 102 has a first conductive type, and has an active device region 106 and a peripheral region 108 surrounding the active device region 106 defined thereon. The active device region 106 is used to dispose transistor devices with switching function, and the peripheral region 108 is used to dispose a structure for protecting the transistor devices so as to avoid the semiconductor device 100 having voltage breakdown. The super junction structure 104 is disposed on the substrate 102, and the super junction structure 104 includes an epitaxial layer 110 having the first conductive type and a plurality of semiconductor layers 112 having a second conductive type. The epitaxial layer 110 is disposed between any two of the adjacent semiconductor layers 112, so that each semiconductor layer 112 and the epitaxial layer 110 are disposed alternatively in sequence. Each semiconductor layer 112 has a width W1, and the epitaxial layer disposed between any two of the adjacent semiconductor layers 112 has a width W2 the same as the width W1. In this embodiment, the first conductive type is N type, and the second conductive type is P type. The present invention is not limited to this, and the first conductive type and the second conductive type also can be interchanged with each other. Furthermore, the N-type epitaxial layer 110 of this embodiment is disposed on the N-type substrate 102, and the N-type epitaxial layer 110 has a plurality of deep trenches 110a. Each P-type semiconductor layer 112 of this embodiment can be constituted by a P-type epitaxial layer, and each P-type semiconductor layer 112 is respectively disposed in each deep trench 110a to fill up each deep trench 110a so that a top surface of each P-type semiconductor and a top surface of the N-type epitaxial layer 110 can be disposed in the same plane. In this embodiment, each deep trench 110a is not in contact with the N-type substrate 102, but the present invention is not limited to this. Each deep trench 110a of the present invention also may be extended downward to be in contact with N-type substrate 102, so that each P-type semiconductor layer 112 can be in contact with the N-type substrate 102. In other embodiments of the present invention, each P-type semiconductor layer 112 of the present invention also can be P-type doped regions in the N-type epitaxial layer 110, and the P-type doped regions formed by performing a P-type ion implantation process and deposition process several times, but is not limited herein.

Furthermore, the peripheral region 108 includes a corner region 108a adjacent to the active device region 106, and the semiconductor device 100 further includes a plurality of P-type doped body regions 114, a plurality of N-type doped source region 116, a plurality of gate structures and a dielectric layer 120. Each P-type doped body region 114 is respectively disposed in each P-type semiconductor layer 112 in the active device region 106 and the corner region 108a, and every two N-type doped source region 116 are respectively disposed in each P-type doped body region 114. Each N-type doped source region 116 is used as a source of the transistor device. Each gate structure 118 is respectively disposed on the N-type epitaxial layer 110 between any two of the adjacent P-type semiconductor layers 112 in the active device region 106, and partially overlaps each P-type doped body region 114 and the corresponding N-type doped source region 116, so that each gate structure can be used as a gate of the transistor device, and each P-type doped body region 114 between each N-type doped source region 116 and N-type epitaxial layer 110 under each gate structure 118 can be used as a channel region of the transistor device. In addition, the N-type epitaxial layer 110 can be used as a drain of the transistor device, and each gate structure 118, each N-type doped source region 116, each P-type doped body region 114 and N-type epitaxial layer 110 can accordingly constitute one of the transistor devices 122. Each gate structure 118 is composed of a conductive layer 118a and an insulating layer 118b, and the insulating layer 118b and the conductive layer 118a are sequentially disposed on the N-type epitaxial layer 110. The dielectric layer 120 covers the gate structures 118 and a part of the P-type semiconductor layers 112 and exposes the P-type doped body regions 114 disposed in each P-type semiconductor layer 112 between the active device region 106 and the corner region 108a, the N-type doped source region 116 and a part of each conductive layer 118a. Moreover, the semiconductor device 100 further includes a source metal layer 124, a gate metal layer 126 and a drain metal layer 128. The source metal layer 124 is disposed on the dielectric layer 120, and the source metal layer 124 is electrically connected to a part of P-type semiconductor layers 112 in the active device region 106 and the corner region 108a. The gate metal layer 126 is disposed on the dielectric layer 120 and surrounds the source metal layer 124, and further is electrically connected to each conductive layer 118a of each gate structure 118. The drain metal layer 128 is disposed under the N-type substrate 102 so as to be electrically connected to the N-type epitaxial layer 110.

Figure 4:
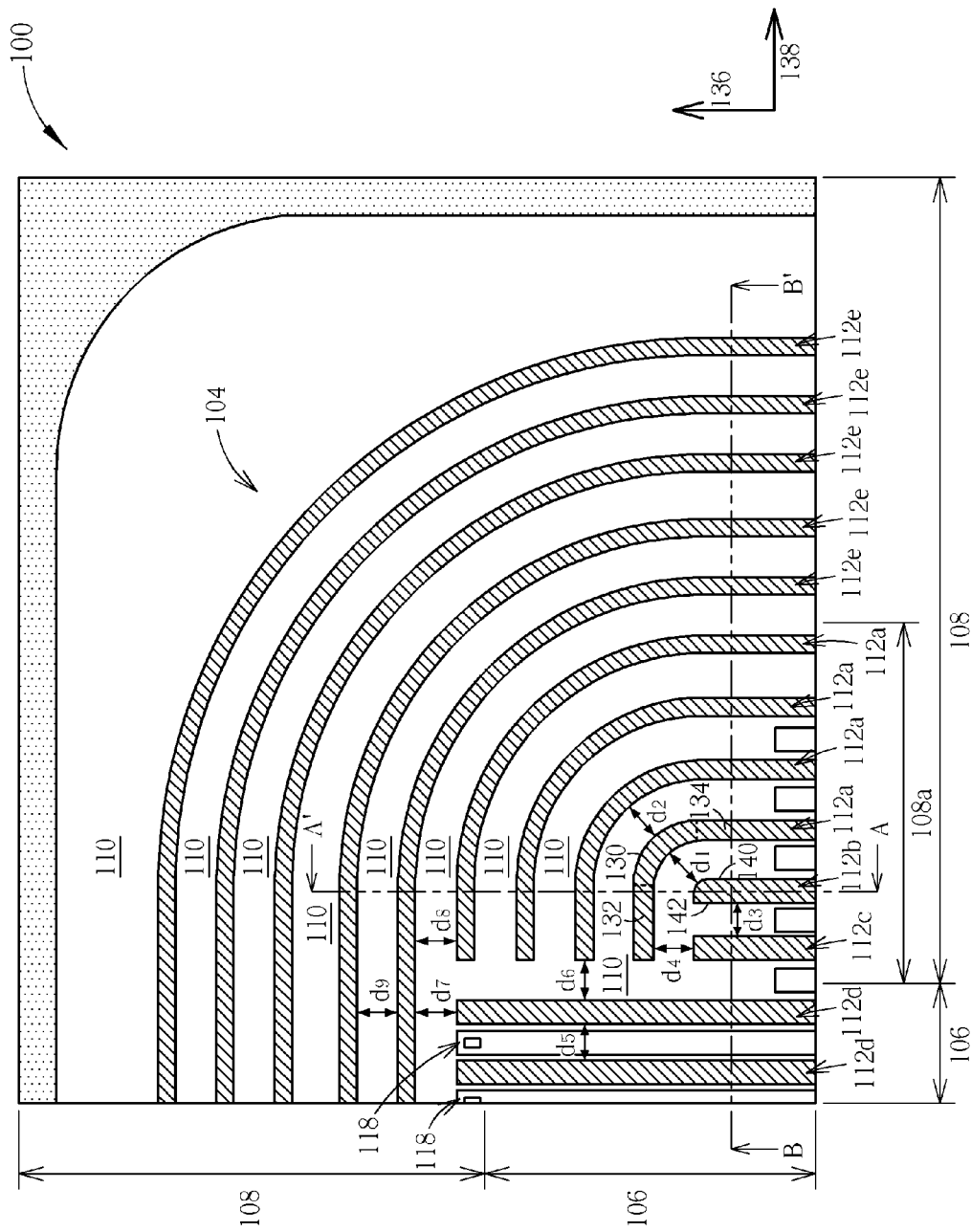
FIG. 4 is a schematic diagram illustrating a top view of the super junction structure according to the preferred embodiment of the present invention.
Figure 5:
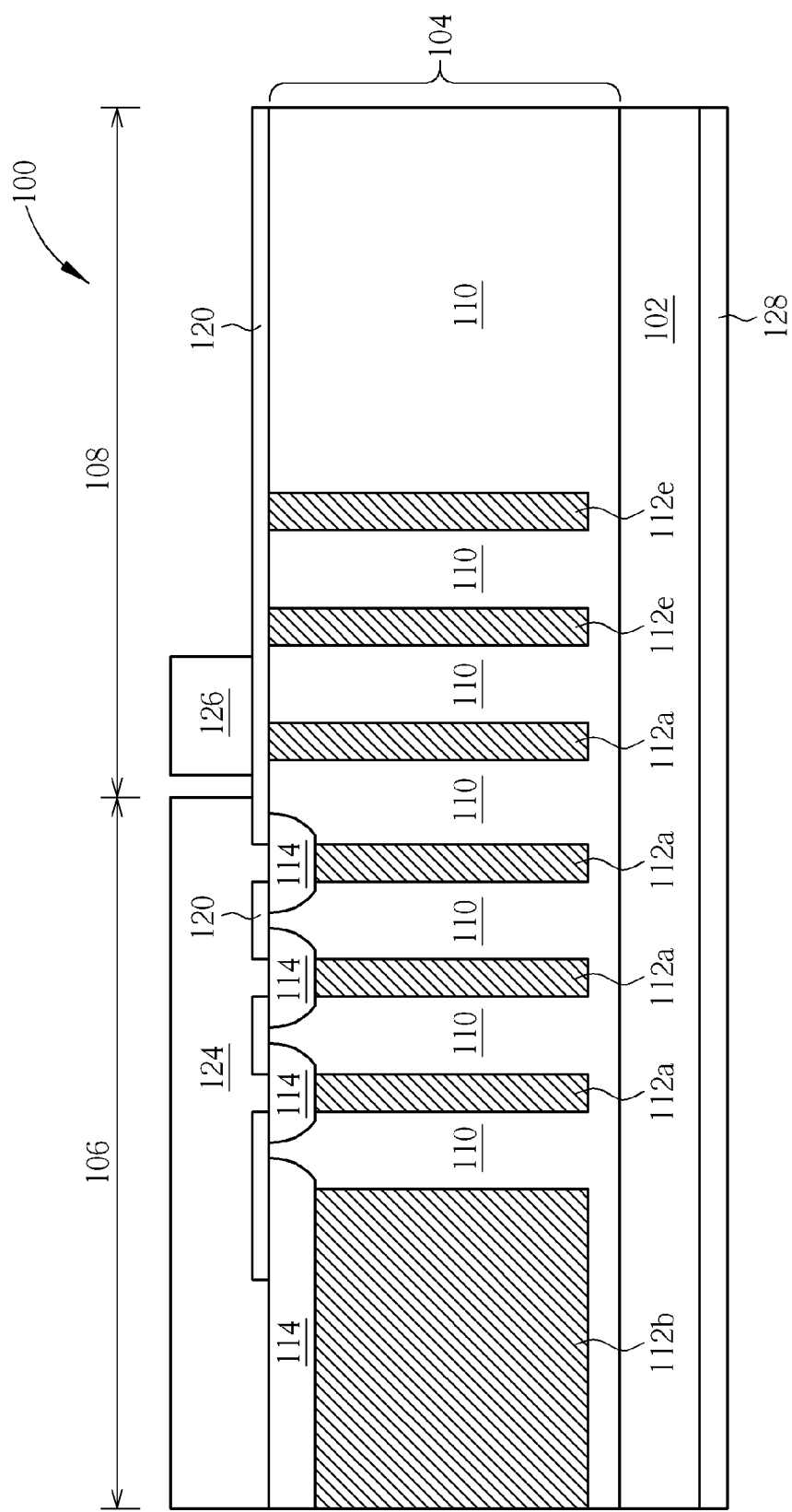
FIG. 5 is a schematic diagram illustrating a cross-sectional view along a cutting line A-A' shown in FIG. 4.

The super junction structure 104 of the semiconductor device 100 in this embodiment will be detailed in the following description. Refer to FIG. 4 and FIG. 5 together with FIG. 3. FIG. 4 is a schematic diagram illustrating a top view of the super junction structure according to the preferred embodiment of the present invention, and FIG. 5 is a schematic diagram illustrating a cross-sectional view along a cutting line A-A' shown in FIG. 4. FIG. 3 is a schematic diagram illustrating a cross-sectional view along a cutting line B-B' shown in FIG. 4. As shown in FIG. 3 through FIG. 5, the P-type semiconductor layers 112 in this embodiment can be divided into a plurality of first P-type semiconductor layers 112a, a second P-type semiconductor layer 112b, a third P-type semiconductor layer 112c, a plurality of fourth semiconductor layers 112d, and a plurality of ringed semiconductor layers 112e. The first P-type semiconductor layers 112a, the second P-type semiconductor layer 112b and the third semiconductor layer 112c are disposed in the N-type epitaxial layer in the corner region 108a, and the fourth semiconductor layers 112d are disposed in the N-type epitaxial layer 108 in the peripheral region 108 outside the corner region 108a. The source metal layer covers a part of first P-type semiconductor layers 112a and is electrically connected to the part of the first P-type semiconductor layers 112a. The gate metal layer covers the outmost first P-type semiconductor layer 112a. Each P-type doped body region 114 is respectively disposed in the fourth P-type semiconductor layers 112d in the active device region 106 and each first P-type semiconductor layer 112a, the second P-type semiconductor layer 112b and the third P-type semiconductor layer 112c in the corner region 108a, and each gate structure 118 is disposed on the N-type epitaxial layer 110 between any two of the adjacent fourth P-type semiconductor layers 112d. Each first P-type semiconductor layer 112a is a strip-shaped semiconductor layer, and each first P-type semiconductor layer 112a has an arc portion 130, a first strip portion 132 extending out from an end of the arc portion 130, and a second strip portion 134 extending out from the other end of the arc portion 130. Each first strip portion 132 is disposed along a first direction 136, and each first strip portion 132 extends toward the active device region 106 and points to the active device region 106. Each second strip portion 134 is disposed along a second direction 138 perpendicular to the first direction 136. The first P-type semiconductor layers 112a are arranged sequentially toward an outside of the peripheral region 108, and a second distance d2 is between any two of the adjacent first P-type semiconductor layer 112a. Furthermore, the second P-type semiconductor layer 112b is strip-shaped, and the second P-type semiconductor layer 112b is disposed in the N-type epitaxial layer 102 in the peripheral region 108 between the active device region 106 and the second strip portion 134. It should be noted that the second P-type semiconductor layer 112b has a first sidewall 140 and a second sidewall 142 opposite to the first sidewall 140, and the first sidewall 140 faces the first P-type semiconductor layers 112a. Furthermore, the second sidewall is parallel to the second strip portion 134. In addition, the first sidewall 140 is parallel to each arc portion 130, and a first distance which is between the first sidewall and the first P-type semiconductor layer 112a most adjacent to the second P-type semiconductor layer 112b is the same as the second distance d2.

Figure 6:
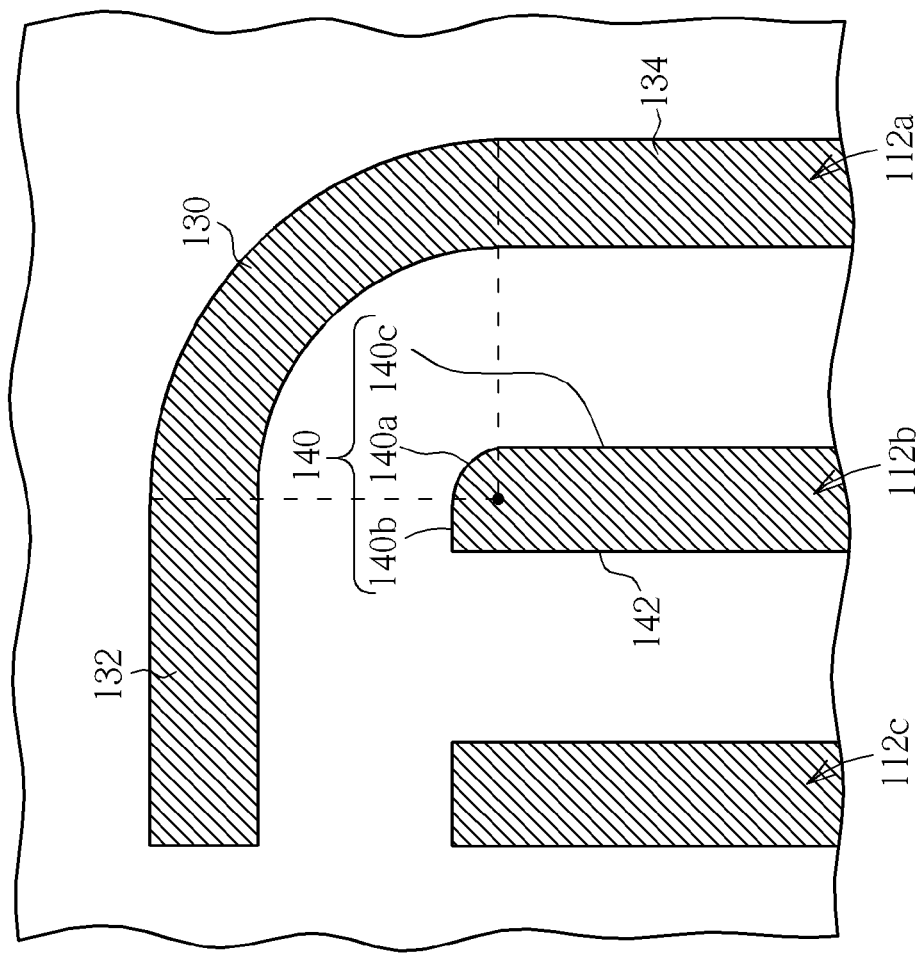
FIG. 6 is a schematic diagram illustrating a top view of the second P-type semiconductor layer according to the preferred embodiment of the present invention.

In order to clearly detail the second P-type semiconductor layer 112b of this embodiment, refer to FIG. 6 together with FIG. 3. FIG. 6 is a schematic diagram illustrating a top view of the second P-type semiconductor layer according to the preferred embodiment of the present invention. As shown in FIG. 3 and FIG. 6, a corner of the second P-type semiconductor layer 112b facing the first P-type semiconductor layers 112a is not a right angle, and the corner of the first sidewall 140 facing the arc portion 130 has an arc surface 138a that is parallel to the arc portion 130. In this embodiment, each arc portion 130 and the arc surface 138a have a same center of arcs so as to form concentric arcs, but the present invention is not limited to this. Furthermore, the first sidewall 140 has a first flat surface 138b facing the first strip portion 132 and a second flat surface 138c facing the second strip portion 134. The first flat surface 138b is parallel to the first strip portion 132, and the second flat surface 138c is parallel to the second strip portion 134. Accordingly, the second P-type semiconductor layer 112b and the N-type epitaxial layer 110 disposed between the second P-type semiconductor layer 112b and the first P-type semiconductor layer 112a most adjacent to the second P-type semiconductor layer 112b do not have sharp structure, and the voltage breakdown between the second P-type semiconductor layer 112b and the N-type epitaxial layer 110 resulted from the second P-type semiconductor layer 112b and the N-type epitaxial layer 110 having high electric field can be avoided. In addition, the first sidewall of the second P-type semiconductor layer 112b is parallel to the first P-type semiconductor layer 112a most adjacent to the second P-type semiconductor layer 112b, so that the first distance d1 between the first sidewall 140 and the first P-type semiconductor layer 112a would not vary in different positions. For this reason, the second P-type semiconductor layer 112b, the first P-type semiconductor layer 112a and the N-type epitaxial layer 110 between the second P-type semiconductor layer 112b and the first P-type semiconductor layer 112a can have uniform electric field, and the decrease of the voltage bearing ability can be avoided. In other words, the N-type epitaxial layer 110 between the second P-type semiconductor layer 112b and the first P-type semiconductor layer 112a most adjacent to the second P-type semiconductor layer 112b has a uniform width, and can tolerate the same voltage. Therefore, the problem of the decrease of the voltage bearing ability due to different widths of the N-type epitaxial layer 110 can be avoided.

Furthermore, the third P-type semiconductor layer 112c is disposed in the N-type epitaxial layer 110 in the peripheral region 108 between the second P-type semiconductor layer 112b and the active device region 106, and the third P-type semiconductor layer 112c is strip-shaped. The third P-type semiconductor layer 112c is parallel to second sidewall 142 and the second strip portion 134, so that the N-type epitaxial layer 110 between the third P-type semiconductor layer 112c and the second P-type semiconductor layer 112b can have a uniform width. A third distance which is between the third P-type semiconductor layer 112c and the second sidewall 142 of the second P-type semiconductor layer 112b is the same as the first distance d1, and thus the N-type epitaxial layer 110 between the second P-type semiconductor layer 112b and the N-type epitaxial layer 110 between the second P-type semiconductor layer 112b and the first P-type semiconductor layer 112a most adjacent to the second P-type semiconductor layer 112b can have the same width and have the same voltage bearing ability. In addition, a fourth distance d4 is between the third P-type semiconductor layer 112c and the first P-type semiconductor layer 112a most adjacent to the second P-type semiconductor layer 112a, and is the same as the first distance d1. The third P-type semiconductor layer 112c is used to determine the distance of the first strip portion 132 extending out toward the active device region 106, so that a sidewall of the third P-type semiconductor layer 112c facing the active device region 106 and a sidewall of each first strip portion 132 facing the active device region 106 can be disposed in the same plane.

In the other embodiments of the present invention, the super junction 104 also cannot have the third P-type semiconductor layer 112, and the second sidewall 142 of the second P-type semiconductor layer 112b can be used to determine the distance of the first strip portion 132 extending out toward the active device region 106 so as to align the first strip portion 132 and the second sidewall 142 of the second P-type semiconductor layer 112b. A second sidewall 142 of the second P-type semiconductor layer 112b facing the active device region 106 and a sidewall of each first strip portion 132 facing the active device region 106 are therefore disposed in the same plane.

Besides, the fourth P-type semiconductor layer 112d is disposed in the N-type epitaxial layer 110 in the active device region 106, and each fourth semiconductor layer 112d which is strip-shaped is parallel to the second strip portion 134. A fifth distance d5 is between any two of the adjacent fourth P-type semiconductor layers 112d and is the same as the first distance d1. Because the sidewall of the third P-type semiconductor layer 112c facing the active device region 106 and the sidewall of each first strip portion 132 facing the active device region 106 are disposed in the same plane, a sixth distance d6 that is between each strip portion 132 and the fourth P-type semiconductor layer 112d most adjacent to the first strip portions 132 is the same as the first distance d1. Also, a sidewall of each fourth P-type semiconductor layer 112d facing the peripheral region 108 and a surface of the outmost first strip portion 132 facing the outside of the peripheral region 108 are in the same plane. In the present invention, the semiconductor device 100 is not limited to have a plurality of the first P-type semiconductors 112a, and can only have one first P-type semiconductor layer 112a. The number of the first P-type semiconductor layer 112a of the present invention can be determined according to the outmost first strip portion 132 being able to be aligned with an end of each fourth semiconductor layer 112d.

In this embodiment, the P-type ringed semiconductor layer 112e is disposed in the N-type epitaxial layer 110 in the peripheral region 108, and each P-type ringed semiconductor layer 112e surrounds the active device region 106, the fourth P-type semiconductor layers 112d, the first P-type semiconductor layers 112a, the second P-type semiconductor layer 112b and the third P-type semiconductor layer 112c. The P-type ringed semiconductor layers 112e are parallel to each other, and are arranged sequentially toward the outside of the peripheral region 108. A ninth distance d9 is between any two of the adjacent P-type ringed semiconductor layers 112e, and is the same as the first distance d1 and the fifth distance d5. Furthermore, a seventh distance is between the inmost P-type ringed semiconductor layer and each fourth P-type semiconductor layer 112d, and an eighth distance is between the P-type ringed semiconductor layer 112e most adjacent to the active device region 106 and the first P-type semiconductor layer 112a adjacent to the P-type ringed semiconductor layer 112e. The seventh distance d7 and the eighth distance are the same as the first distance d1. In addition, the semiconductor device 100 of the present invention is not limited to have a plurality of the P-type ringed semiconductor layers 112e, and also can only have a P-type ringed semiconductor layers 112e.

It should be noted that the fourth P-type semiconductor layers 112d and the N-type epitaxial layer 110 disposed between them are disposed in the active device region 106 and used as a voltage bearing structure of the transistor devices 120 in the active device region. In order to allow the voltage bearing structure in the active device region to determine the condition of the breakdown voltage of the semiconductor device 100, the fifth distance d5 between any two of the adjacent fourth P-type semiconductor layers 112d is the same as the first distance d1, the second distance d2, the third distance d3, the fourth distance d4, the sixth distance d6, the seventh distance d7, the eighth distance d8 and the ninth distance d9, i.e. widths W1 between the adjacent semiconductor layers 112 are the same, and thus the N-type epitaxial layer 110 between the adjacent P-type semiconductor layers 112 has the same widths. Therefore, the voltage bearing ability of the semiconductor device 100 can be determined by the super junction structure 104 formed by the fourth P-type semiconductor layers 112d in the active device region 106 and the N-type epitaxial layer 110 between the fourth P-type semiconductor layers 112d.

As the above-mentioned description, the present invention provides the second P-type semiconductor layer having the arc surface and the curved first P-type semiconductor layer in the semiconductor device, and the arc surface is parallel to the arc portion of the first P-type semiconductor layer, so that the distances between the adjacent P-type semiconductor layers can be the same. Accordingly, the N-type epitaxial layer between the adjacent P-type semiconductor layers can have the same width. Thus, the voltage bearing ability of the semiconductor device can be determined by the super junction structure in the active device region, and cannot be limited by the super junction structure between the active device region and the peripheral region. Furthermore, the high electric field generated from the right angle structure can be avoided.

Those skilled in the art will readily observe that numerous modifications and alterations of the device and method may be made while retaining the teachings of the invention.

What is claimed is:

1. A semiconductor device, comprising:
    a substrate, having a first conductive type and having an active device region and a peripheral region surrounding the active device region defined thereon;
    an epitaxial layer, having the first conductive type and disposed on the substrate;
    at least one first semiconductor layer, having a second conductive type, and disposed in the epitaxial layer of the peripheral region, the first semiconductor layer having an arc portion, a first strip portion extending out from an end of the arc portion, and a second strip portion extending out from the other end of the arc portion, wherein the first strip portion points to the active device region, and the second strip portion is perpendicular to the first strip portion; and
    a second semiconductor layer, having the second conductive type, disposed in the epitaxial layer of the peripheral region between the active device region and the second strip portion, and the second semiconductor layer having a first sidewall and a second sidewall opposite to the first sidewall, the first facing the first semiconductor layer, wherein the first sidewall is parallel to the first semiconductor layer, and a first distance is between the first sidewall and the first semiconductor layer.

2. The semiconductor device according to claim 1, wherein the at least one first semiconductor layer comprises a plurality of first semiconductor layers parallel to each other and arranged toward an outside of the peripheral region sequentially, and a second distance is between any two of the adjacent semiconductor layers and the same as the first distance.

3. The semiconductor device according to claim 1, wherein the first sidewall has an arc surface parallel to the arc portion.

4. The semiconductor device according to claim 1, wherein the first sidewall has a first flat surface parallel to the first strip portion and a second flat surface perpendicular to the first flat surface, and the second flat surface is parallel to the second strip portion.

5. The semiconductor device according to claim 4, further comprising at least one third semiconductor layer, having the second conductive type and disposed in the epitaxial layer of the peripheral region between the second semiconductor layer and the active device region, wherein the third semiconductor layer is parallel to the second flat surface and the second strip portion.

6. The semiconductor device according to claim 5, wherein a sidewall of the third semiconductor layer facing the active device region and a sidewall of the first strip portion facing the active device region are disposed at a same plane.

7. The semiconductor device according to claim 5, wherein a third distance is between the third semiconductor layer and the second semiconductor layer, and a fourth distance is between the third semiconductor layer and the first semiconductor layer, wherein the second distance and the third distance are the same as the first distance.

8. The semiconductor device according to claim 1, further comprising a plurality of fourth semiconductor layers, having the second conductive type, wherein the fourth semiconductor layer is disposed in the epitaxial layer of the active device region and parallel to the second strip portion.

9. The semiconductor device according to claim 8, wherein a fifth distance is between any two of the adjacent fourth semiconductor layers, and the fifth distance is the same as the first distance.

10. The semiconductor device according to claim 8, wherein a sixth distance is between the first strip portion and the fourth semiconductor layer most adjacent to the first strip portion, and the sixth distance is the same as the first distance.

11. The semiconductor device according to claim 8, wherein the first semiconductor layer, the second semiconductor layer and the fourth semiconductor layers are electrically connected to a source metal layer.

12. The semiconductor device according to claim 8, further comprising at least one ringed semiconductor layer, having the second conductive type and disposed in the epitaxial layer of the peripheral region, and the ringed semiconductor layer surrounding the active device region, the first semiconductor layer and the second semiconductor layer.

13. The semiconductor device according to claim 12, wherein a seventh distance is between the ringed semiconductor layer and each fourth semiconductor layer, and an eighth distance is between the ringed semiconductor layer and the first semiconductor layer, wherein the seventh distance and the eighth distance are the same as the first distance.

14. The semiconductor device according to claim 12, wherein the at least one ringed semiconductor layer comprises a plurality of ringed semiconductor layers parallel to each other and arranged sequentially toward an outside of the peripheral region, and a ninth distance is between any two of the adjacent ringed semiconductor layers and the same as the first distance.

15. The semiconductor device according to claim 8, further comprising:
   a plurality of doped body regions, having the second conductive type, each doped body region being respectively disposed in the fourth semiconductor layer;
   a plurality of gate structures, respectively disposed on the epitaxial layer between any two of the adjacent fourth semiconductor layers; and
   a plurality of doped source region, respectively disposed in each doped body region.

16. The semiconductor device according to claim 15, wherein a source metal layer is electrically connected to the first semiconductor layer, the second semiconductor layer and the doped body regions.

* * * * *